United States Patent
McLaughlin et al.

(10) Patent No.: US 9,325,338 B2
(45) Date of Patent: Apr. 26, 2016

(54) ADAPTIVE TERNARY A/D CONVERTER FOR USE IN AN ULTRA-WIDEBAND COMMUNICATION SYSTEM

(71) Applicants: Michael McLaughlin, Dublin (IE); Mici McCullagh, Northern Ireland (GB); Ciarán McElroy, Dublin (IE)

(72) Inventors: Michael McLaughlin, Dublin (IE); Mici McCullagh, Northern Ireland (GB); Ciarán McElroy, Dublin (IE)

(73) Assignee: DecaWave Ltd., Dublin (IE)

( * ) Notice: Subject to any disclaimer, the term of this patent is extended or adjusted under 35 U.S.C. 154(b) by 0 days.

(21) Appl. No.: 13/775,303

(22) Filed: Feb. 25, 2013

(65) Prior Publication Data

US 2014/0062737 A1    Mar. 6, 2014

Related U.S. Application Data

(62) Division of application No. 13/033,098, filed on Feb. 23, 2011, now Pat. No. 8,436,758.

(60) Provisional application No. 61/316,299, filed on Mar. 22, 2010.

(51) Int. Cl.
| | |
|---|---|
| *H03M 1/12* | (2006.01) |
| *H03M 1/34* | (2006.01) |
| *H04B 1/7163* | (2011.01) |
| *H03M 1/06* | (2006.01) |

(52) U.S. Cl.
CPC ...... *H03M 1/12* (2013.01); *H03M 1/34* (2013.01); *H04B 1/7163* (2013.01); *H03M 1/0607* (2013.01)

(58) Field of Classification Search
CPC ........ H03M 1/34; H03M 1/0607; H03M 1/12
USPC ......................................... 341/155, 157, 159
See application file for complete search history.

(56) References Cited

U.S. PATENT DOCUMENTS

| | | | | |
|---|---|---|---|---|
| 4,851,841 A | * | 7/1989 | Sooch ............................ | 341/143 |
| 7,116,254 B1 | * | 10/2006 | Nagai et al. ................... | 341/143 |
| 7,466,251 B2 | * | 12/2008 | Uchino ......................... | 341/120 |
| 8,188,902 B2 | * | 5/2012 | Mitikiri et al. ................. | 341/163 |
| 8,436,758 B2 | * | 5/2013 | McLaughlin et al. ........ | 341/155 |

OTHER PUBLICATIONS

Amoroso, "Adaptive A/D Converter to Suppress CW Interference in DSPN Spread-Spectrum Communications", IEEE Trans. on Comm., vol. COM-31, No. 10, Oct. 1983, pp. 1117-1123.

(Continued)

*Primary Examiner* — Brian Young
(74) *Attorney, Agent, or Firm* — Jeffrey Van Myers; Artie A. Pennington

(57) ABSTRACT

In an ultra-wideband communication system, a 1-trit ternary analog-to-digital converter ("ADC") having dynamic threshold adaption and providing an output in ternary form [+1, 0, −1]. The ternary ADC includes a pair of 1-bit binary ADCs, one being configured in a non-inverting form, and one being configured in an inverting form. Each binary ADC includes an feedback network mechanism, thereby allowing for simultaneous and independent adaptation of the pair of thresholds, compensating for the effects of any DC offset that may be present. The use of a trit-based ternary encoding scheme improves system entropy.

14 Claims, 3 Drawing Sheets

(56) References Cited

OTHER PUBLICATIONS

Carr, "A Visit to Computation Centers in the Soviet Union", Comm. of the ACM, 1959, pp. 8-20.

Ware, "Soviet Computer Technology—1959", Comm. of the ACM, 1960, pp. 131-166.

\* cited by examiner

ADAPTIVE TERNARY A/D CONVERTER FOR USE IN AN ULTRA-WIDEBAND COMMUNICATION SYSTEM

CROSS-REFERENCE TO RELATED APPLICATIONS

This application is a Divisional of application Ser. No. 13/033,098, filed 23 Feb. 2011 ("Parent Application"). This application claims priority to U.S. Provisional Patent Application Ser. No. 61/316,299 ("Parent Provisional"), filed Mar. 22, 2010. The foregoing Parent Application and Parent Provisional are hereby incorporated by reference in their entirety as if fully set forth herein.

BACKGROUND OF THE INVENTION

1. Field of the Invention

The present invention relates generally to ultra-wideband communication systems, and, in particular, to a ternary analog-to-digital converter for use in an ultra-wideband communication system.

2. Description of the Related Art

In general, in the descriptions that follow, we will italicize the first occurrence of each special term of art, which should be familiar to those skilled in the art of ultra-wideband ("UWB") communication systems. In addition, when we first introduce a term that we believe to be new or that we will use in a context that we believe to be new, we will bold the term and provide the definition that we intend to apply to that term. In addition, throughout this description, we will sometimes use the terms assert and negate when referring to the rendering of a signal, signal flag, status bit, or similar apparatus into its logically true or logically false state, respectively, and the term toggle to indicate the logical inversion of a signal from one logical state to the other. Alternatively, we may refer to the mutually exclusive boolean states as logic_0 and logic_1. Of course, as is well know, consistent system operation can be obtained by reversing the logic sense of all such signals, such that signals described herein as logically true become logically false and vice versa. Furthermore, it is of no relevance in such systems which specific voltage levels are selected to represent each of the logic states.

Generally, in an ultra-wideband ("UWB") communication system, a series of special processing steps are performed by a UWB transmitter to prepare payload data for transmission via a packet-based UWB channel. Upon reception, a corresponding series of reversing steps are performed by a UWB receiver to recover the data payload. Details of both series of processing steps are fully described in IEEE Standards 802.15.4 ("802.15.4") and 802.15.4a ("802.15.4a"), copies of which are submitted herewith and which are expressly incorporated herein in their entirety by reference. As is known, these Standards describe required functions of both the transmit and receive portions of the system, but specific implementation details only of the transmit portion of the system, leaving to implementers the choice of how to implement the receive portion.

One of us, Michael McLaughlin, has developed certain improvements for use in UWB communication systems, which improvements are fully described in the following pending applications or issued patents, all of which are expressly incorporated herein in their entirety:

"A Method and Apparatus for Generating Codewords", application Ser. No. 11/309,221, filed 13 Jul. 2006;

"A Method and Apparatus for Generating Codewords", application Ser. No. 11/309,222, filed 13 Jul. 2006, now abandoned;

"A Method and Apparatus for Transmitting and Receiving Convolutionally Coded Data", U.S. Pat. No. 7,636,397, issued 22 Dec. 2009; and "A Method and Apparatus for Transmitting and Receiving Convolutionally Coded Data", application Ser. No. 12/590,124, filed 3 Nov. 2009.

Some of us have participated in the development of certain improvements in a receiver for use in UWB communication systems, which improvements are fully described in the following pending application, which is expressly incorporated herein in its entirety:

"A Receiver for Use in an Ultra-Wideband Communication System", application Ser. No. 12/885,517, filed 19 Sep. 2010 ("Related Application").

A problem of particular note in these spread-spectrum systems is a natural tension between simplicity, low power, and performance. Within the context of a spread-spectrum system, support for the above mentioned 802.15.4a standard is premised upon the ability to quickly and accurately convert the transmitted analog signal to a corresponding digital equivalent for processing, and at the same time minimizing the overall size and power of the associated circuitry. This desire for reduced area and power would naturally lead to quantizing as coarsely as the desired performance will permit. While it has been proposed to implement the front-end of a spread-spectrum receiver using a fast, 1-bit analog-to-data converter ("ADC") to reduce the size (in terms of transistor count) of the convolution logic in both the channel impulse response ("CIR") estimator and the channel matched filter ("CMF"), such implementations are known to be particularly sensitive to continuous-wave ("CW") interference. This CW interference can be substantially rejected using a full 2-bit, sign+magnitude implementation such as that described by F. Amoroso in "Adaptive A/D Converter to Suppress CW Interference in DSPN Spread-Spectrum Communications", IEEE Trans. on Communications, vol. COM-31, No. 10, October 1983, pp. 1117-1123 ("Amoroso83"), a copy of which is submitted herewith and which is expressly incorporated herein in its entirety by reference.

We have noted that, in a system adapted to quantize in units of binary digits or bits, such as that described in Amoroso83, having dual representations of the 0-state, i.e., [−0, +0], tends to increase system entropy, resulting in less-than-optimal circuit/power efficiency. One possible solution would be to implement a system adapted to quantize in units of ternary digits or trits, such as that used in a pair of obscure computers built in the Soviet Union many years ago. See, "*A Visit to Computation Centers in the Soviet Union,*" Comm. of the ACM, 1959, pp. 8-20; and "*Soviet Computer Technology—1959*", Comm. of the ACM, 1960, pp. 131-166; copies of which are submitted herewith and which are expressly incorporated herein in their entirety by reference. Unfortunately, today (as was the case in these old machines), the available circuit technology is unable efficiently to represent and manipulate trits per se.

We submit that what is needed is an improved method and apparatus for use in the receiver of a UWB communication system for performing the analog-to-digital conversion. In particular, we submit that such a method and apparatus should provide performance generally comparable to the best prior art techniques while requiring less circuitry and consuming less power than known implementations of such prior art techniques.

BRIEF SUMMARY OF THE INVENTION

In accordance with the preferred embodiment of our invention, we provide an analog-to-digital converter (ADC) comprising a first comparator, a first feedback network, a second comparator, and a second feedback network. The first comparator is adapted to receive an analog signal and to receive a first feedback voltage. The first comparator compares the analog signal and the first feedback voltage, and generates a logic_1 value if the analog signal is greater than the first feedback signal. Conversely, the first comparator will generate a logic_0 value if the analog signal is less than the first feedback voltage. The first feedback network is adapted to develop the first feedback voltage as a function of an average of the values output by the first comparator. The second comparator is adapted to receive an analog signal and to receive a second feedback voltage. The second comparator compares the analog signal and the second feedback voltage, and generates a logic_1 value if the analog signal is less than the second feedback signal. Conversely, the second comparator will generate a logic_0 value is the analog signal is greater than the second feedback voltage. The second feedback network is adapted to develop the second feedback voltage as a function of an average of the values output by the second comparator.

In accordance with another preferred embodiment of our invention, we provide a method of analog to digital conversion. The method comprises the steps of receiving an analog signal, receiving a first feedback voltage, comparing the analog signal to the first feedback voltage, and responding by providing a first output. This first output will have a logic_1 value if the analog signal is greater than the first feedback voltage, and it will have a logc_0 value if the analog signal is less than the first feedback voltage. The method further comprises the step of developing the first feedback voltage as a function of an average number of the values of the first output. The method further comprises the steps of receiving a second feedback voltage, comparing the analog signal to the second feedback voltage, and responding by providing a second output. This second output will have a logic_1 value if the analog signal is less than the second feedback voltage, and it will have a logc_0 value if the analog signal is greater than the second feedback voltage. The method further comprises the step of developing the second feedback voltage as a function of an average of the values of the second output.

In accordance with another preferred embodiment of our invention, we provide a method of analog to digital conversion. The method comprises the steps of receiving by a first comparator an analog signal, receiving by the first comparator a first feedback voltage, comparing by the first comparator the analog signal to the first feedback voltage, and responding by providing a logic_1 value if the analog signal is greater than the first feedback voltage and a logic_0 value if the analog signal is less than the first feedback voltage. The method further comprises the step of developing by the first feedback network the first feedback voltage as a function of an average number of the values output by the first comparator. The method further comprises the steps of receiving by a second comparator an analog signal, receiving by the second comparator a second feedback voltage, comparing by the second comparator the analog signal to the second feedback voltage, and responding by providing a logic_1 value if the analog signal is less than the second feedback voltage and a logic_0 value if the analog signal is greater than the second feedback voltage. The method further comprises the step of developing by the second feedback network the second feedback voltage as a function of an average number of the values output by the second comparator.

In accordance with another preferred embodiment of our invention, we provide an analog-to-digital converter (ADC) comprising a first binary ADC adapted to receive an analog input and to produce a first binary value as a function of the input and a positive analog feedback signal. The ADC further comprises a second binary ADC adapted to receive the analog input and to produce a second binary value as a function of the input and a negative analog feedback signal. The first and second ADC each comprise a comparator which is adapted to provide the respective binary value as a function of the analog signal and the respective feedback signal, and a feedback network adapted to provide the respective feedback signal as a function of an average of the respective binary values.

In accordance with another preferred embodiment of our invention, we provide a method of analog-to-digital conversion comprising the steps of: developing a first binary value of an analog input signal by performing a 1-bit analog to digital conversion in a non-inverting form; and, developing a second binary value of the analog input signal by performing a 1-bit analog to digital conversion in an inverting form. Each of the developing steps further comprises the steps of: developing a respective binary value by comparing the analog signal and a respective analog feedback voltage, the binary value having a first logic value if the analog signal is greater than the respective feedback voltage, and a second logic value if the analog signal is less than the respective feedback voltage; developing an average of the binary values; developing a smoothed average of the average; and, developing the respective analog feedback voltage by performing a digital to analog conversion of the smoothed average.

We submit that each of the embodiments provides an improved method or apparatus for use in the receiver of a UWB communication system for performing the analog-to-digital conversion. In particular, we submit that each of our embodiments provides performance generally comparable to the best prior art techniques while requiring less circuitry and consuming less power than known implementations of such prior art techniques.

BRIEF DESCRIPTION OF THE SEVERAL VIEWS OF THE DRAWINGS

Our invention may be more fully understood by a description of certain preferred embodiments in conjunction with the attached drawings in which.

Figure 1:
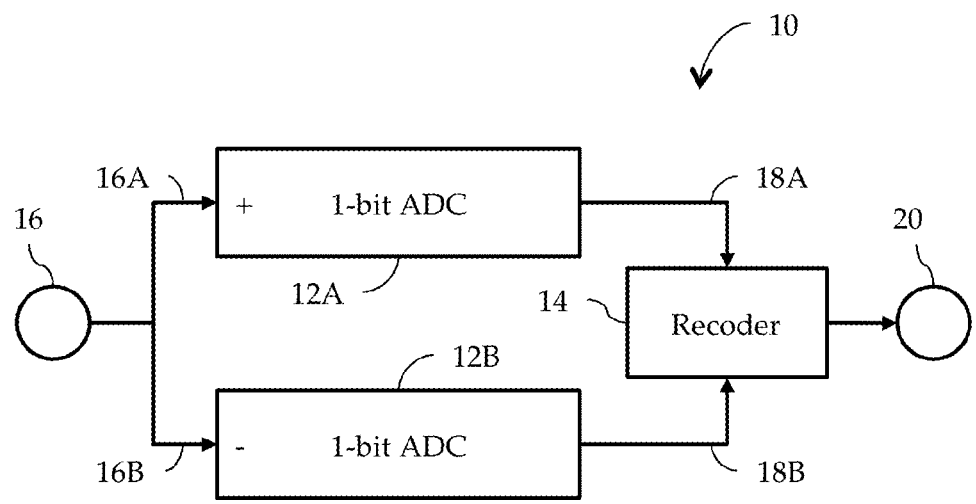
FIG. 1 illustrates, in block diagram form, a trit-based ADC constructed in accordance with a preferred embodiment of our invention.

In the drawings, similar elements will be similarly numbered whenever possible. However, this practice is simply for convenience of reference and to avoid unnecessary proliferation of numbers, and is not intended to imply or suggest that our invention requires identity in either function or structure in the several embodiments.

DETAILED DESCRIPTION OF THE INVENTION

In accordance with the preferred embodiment of our invention illustrated in FIG. 1, our trit-based analog-to-digital converter ("ADC") 10 (note: hereinafter, we will underline the reference numeral of an element to emphasize that it operates in a trit mode) includes a non-inverting 1-bit ADC 12A, an inverting 1-bit ADC 12B, and a binary-to-ternary recoder 14. In general, the analog input signal 16 is applied to selected inputs 16A/B of ADCs 12A/B, and, in response, each provides a respective binary output, 18A/B. Recoder 14 is adapted to receive the binary outputs 18A/B generated by ADCs 12A/B, and to provide a trit output 20 in ternary form, i.e., [−1, 0, +1].

Figure 5:
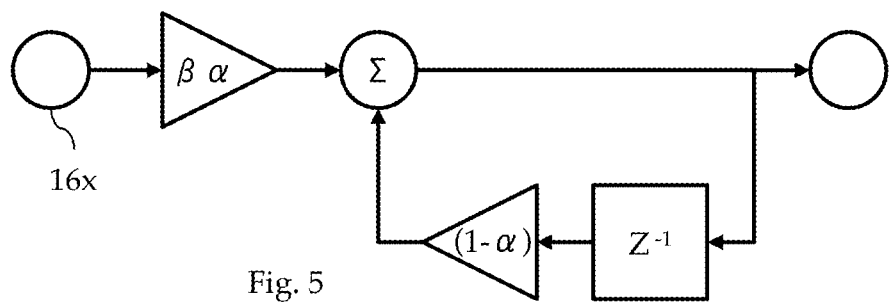
FIG. 5 illustrates, in block diagram form, the general form of a low pass filter suitable for use in the feedback network illustrated in FIG. 3.

In the context of our invention, our ADC 10 can be distinguished from a conventional sign+magnitude implementation such as that described in Amoroso83, cited above. Consider the strategy for A/D conversion shown in FIG. 5 of Amoroso83; and, note, especially, that there are three separate and distinct switching thresholds: (i) a sign threshold $[T_0]$; (ii) a positive magnitude threshold $[T_0+\Delta]$; and (iii) a negative magnitude threshold $[T_0-\Delta]$. (See, also, Amoroso83, p. 1119, lines 21-24.) We have discovered that adapting our ADC 10 to use ONLY the positive and negative thresholds results in only a very small loss in resolution. Accordingly, in our preferred embodiment, ADC 10 does not implement a separate and distinct sign threshold $[T_0]$, thereby simplifying the circuit while simultaneously improving the conversion time of the ADC 10 and most importantly, considerably simplifying the digital processing required after the ADC. In contrast to a conventional sign+magnitude implementation, our trit-based ADC 10 can be readily adapted to operate either at a higher sample rate (improved performance but with more power) or at an equivalent sample rate (substantially equivalent performance but with less power).

As will be apparent, during normal operation, the ADCs 12A/B may develop four different output combinations; each is recoded by recoder 14 into three distinct trit values as indicated in the following Table 1:

TABLE 1

Recoding of comparator outputs to trit values.

| Positive Comparator Output | Negative Comparator Output | Trit Value |
|---|---|---|
| 0 | 0 | 0 |
| 0 | 1 | −1 |
| 1 | 0 | +1 |
| 1 | 1 | 0 |

We have defined this recoding such that normal zero crossings of the analog input signal 16, i.e., when both ADCs 12A/B simultaneously output a logic_0, are recoded to the trit_0 value. In certain cases, such as when the analog input 16 is very near zero and the ADCs 12A/B are not electrically identical, both ADCs 12A/B may simultaneously output logic_1 values. Since this situation will, in general occur relatively rarely, we prefer to recode this case to the trit_0 value.

Figure 2:
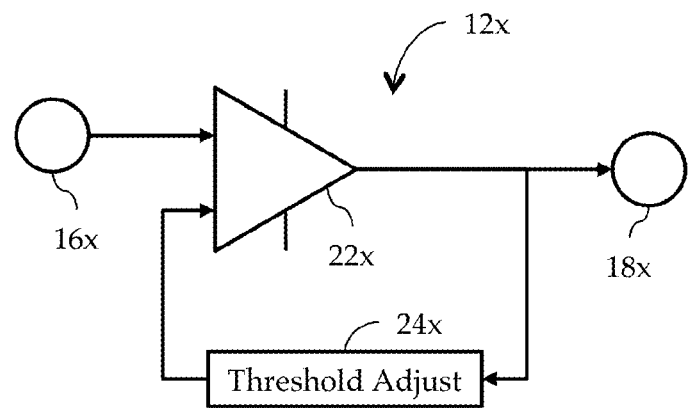
FIG. 2 illustrates, in block diagram form, the general form of each of the 1-bit ADCs illustrated in FIG. 1.

As shown in FIG. 2, each of our ADCs 12x comprises a high-gain operational amplifier 22x (referred to hereinafter as a comparator), and a feedback network 24x. In accordance with our invention, feedback network 24x is adapted dynamically to adjust the switching threshold of the comparator 22x to compensate for any DC offset that may be present in the analog input 16x.

In ADC 12A, the feedback network 24[A] is connected to the inverting input of comparator 22[A] so as to provide a negative feedback voltage as a function of the output, averaged over time, of comparator 22[A]. In operation, comparator 22[A] performs an analog comparison of analog input 16A and the negative feedback voltage; and provides a logic_1 value when analog input 16A is higher than the negative feedback voltage, and a logic_0 value when analog input 16A is lower than the negative feedback voltage.

In ADC 12B, the feedback network 24[B] is connected to the non-inverting input of comparator 22[B] so as to provide a positive feedback voltage as a function of the output, averaged over time, of comparator 22[B]. In operation, comparator 22[B] performs an analog comparison of analog input 16B and the positive feedback voltage; and provides a logic_1 value when analog input 16B is lower than the positive feedback voltage, and a logic_0 value when analog input 16B is higher than the positive feedback voltage.

Figure 3:
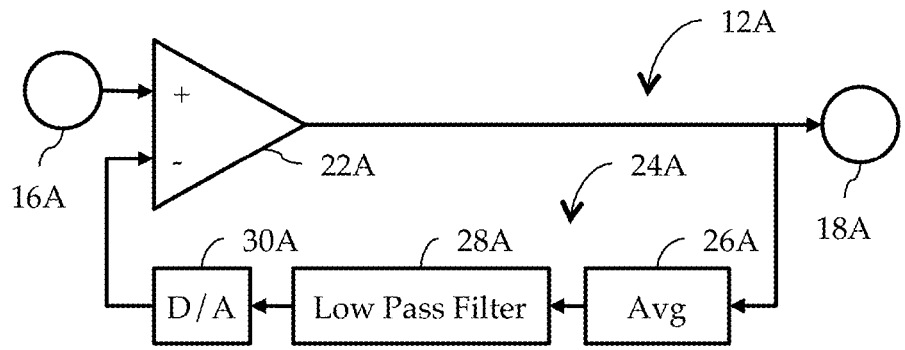
FIG. 3 illustrates, in block diagram form, the general form of the negative feedback network illustrated in FIG. 2.
Figure 4:
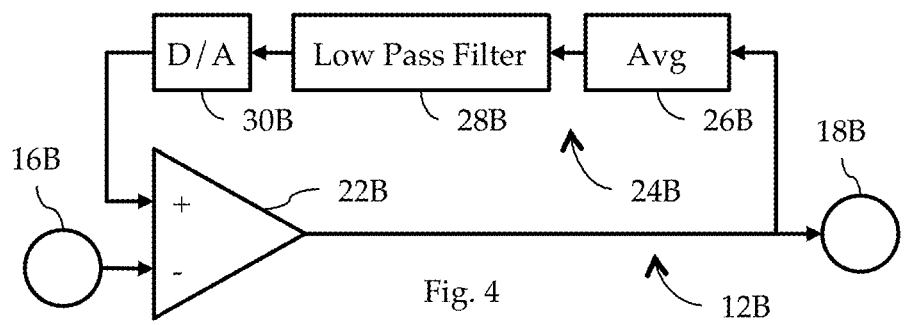
FIG. 4 illustrates, in block diagram form, the general form of the positive feedback network illustrated in FIG. 2.

In accordance with our invention, a suitable feedback network 24x, illustrated in FIG. 3, comprises an averager 26x, a low pass filter 28x, and a digital-to-analog converter ("DAC") 30x. In accordance with our invention, averager 26A/B is adapted to monitor the respective output 18A/B, and to determine the average number of non-zero samples over a predetermined averaging interval. In general, the averaging interval should encompass a reasonably large number of samples. Depending on the desired operating characteristics of ADC 10, averager 26A/B may be adapted to develop the average periodically, i.e., once each averaging interval, For example, in one periodic embodiment, averager 26A/B may be adapted to sum 1024 samples taken over an averaging interval of, say, 1 microsecond, then to divide that sum by the total number of samples taken during that averaging interval (i.e., 1024 in this example); the resultant quotient, comprising a static snapshot of the moving average, would be provided for the duration of the next subsequent averaging interval. Alternatively, in one continuous embodiment, averager 26A/B may be adapted to store, e.g., in a 1-bit wide digital delay line of length 1024, only the most recent set of 1024 samples taken during the same 1 microsecond averaging interval; in response to each new sample, the storage is cycled so as to simultaneously store the new sample while discarding the oldest sample. In this embodiment, averager 26A/B may update the moving average every sample time, thereby providing a more dynamic moving average. Depending on power and performance considerations, as deemed appropriate, the moving average may be updated less often than every sample interval but more often than once each averaging interval.

In accordance with our invention, low pass filter 28A/B is adapted to receive the averages developed by averager 26A/B, and to develop a respective feedback voltage as a function of a smoothed average of a plurality of the most-recently received averages. As illustrated generally in FIG. 5, a suitable low pass filter 28A/B may implement an infinite impulse response ("IIR") transfer function, of the form:

$$y_n = \alpha \beta x_n + (1-\alpha) y_{n-1}$$

wherein:
α determines how fast the filter adapts; and
β controls the proportion of 1's values that will appear in the output.

Figure 6:
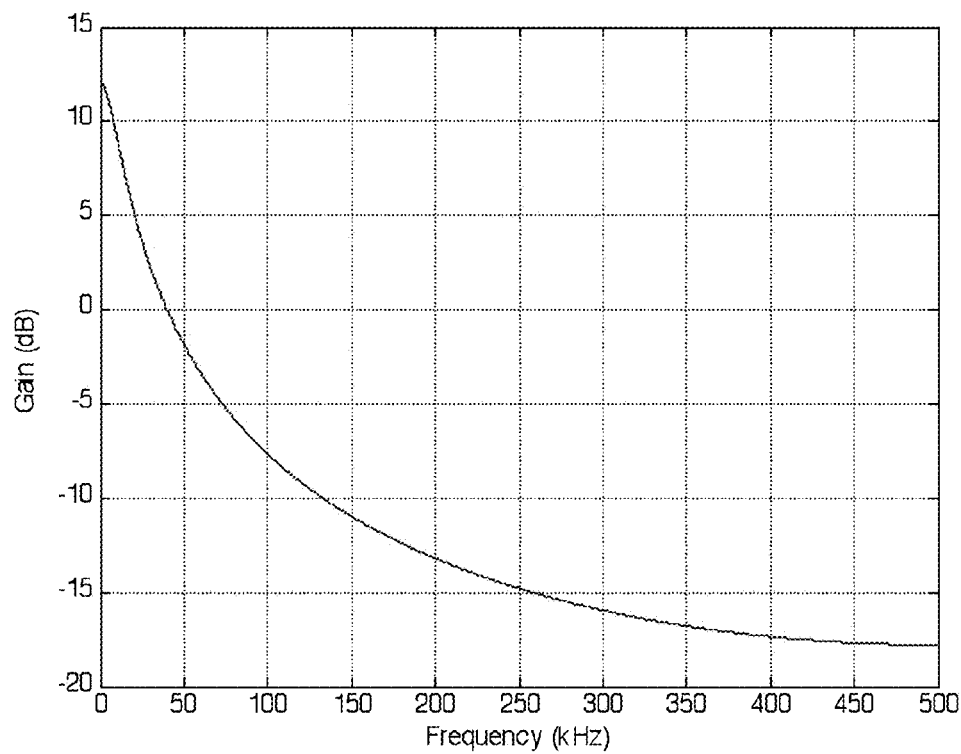
FIG. 6 illustrates the frequency response of an exemplary embodiment of the low pass filter illustrated in FIG. 5.
Figure 7:
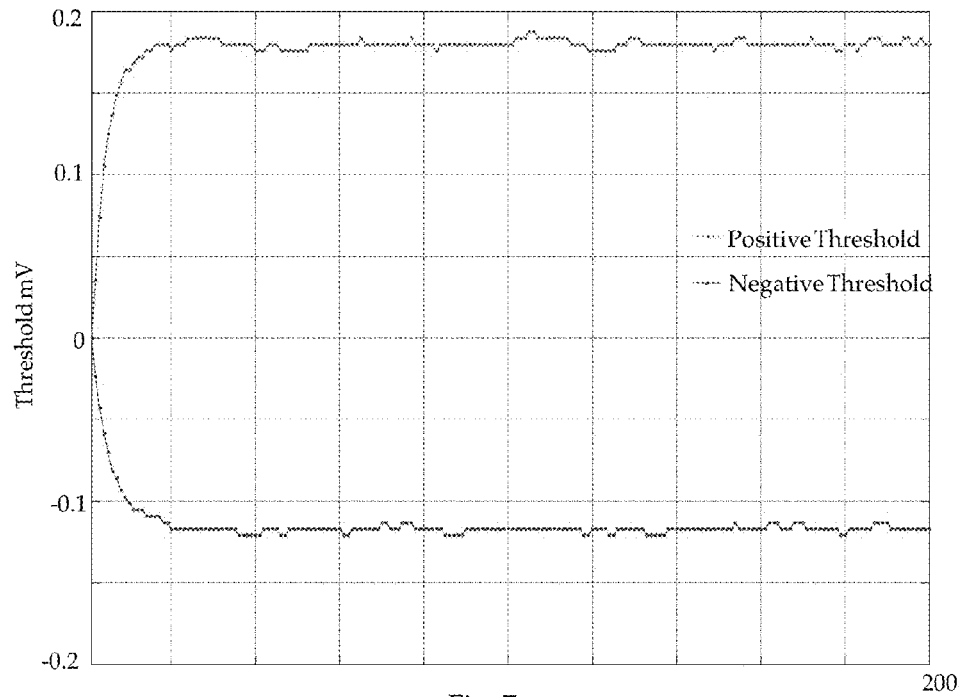
FIG. 7 illustrates, by way of example, the operation of the ADC of FIG. 1 as it adapts the positive and negative feedbacks to compensate for a 50mV DC offset.

In one embodiment, the frequency response of which is illustrated in FIG. 6, the value for the α term is set at 1/16, and the value for the β term is set to 4. FIG. 7 shows how the comparator thresholds vary with time when the input is Gaussian noise with a 50mV DC offset and a standard deviation of 145mV.

In alternate embodiments, coding of trit could be performed in a variety of ways. For example, in one embodiment, the coding of trit could be as a 2's complement value. As a different example, in a different embodiment, the coding of the trit could be as a sign value and a magnitude value. The actual values assigned in the differing examples recited previously can also be encoded a variety of ways. For example, −1 could be represented as 11, 10, 01 or 00. Any representation would be sufficient as long as it can be distinguished from a 0 value and +1 value in the system.

In alternate embodiments, the low pass filter may be implemented using differing forms of the IIR transfer function chosen from the many forms available in this field of art. Alternatively, the low pass filter may be implemented using a finite impulse response ("FIR") transfer function chosen from the many forms available in this field of art.

In our Related Application, we have disclosed an ultra-wideband receiver specially adapted to implement a trit-based ADC constructed in accordance with our invention. As noted therein, use of our ADC in such a system provides distinct advantages over other known ADC technologies.

Thus it is apparent that we have provided a trit-based method and apparatus for analog to digital conversion, the performance of which is generally comparable to the best prior art binary techniques while requiring less circuitry and consuming less power that known implementations of such prior art techniques. Those skilled in the art will recognize that modifications and variations can be made without departing from the spirit of our invention. For example, the functionality of the feedback network 24x may be implemented in software or hardware or a combination thereof. Therefore, we intend that our invention encompass all such variations and modifications as fall within the scope of the appended claims.

What we claim is:

1. An analog-to-digital converter (ADC) comprising:
a first binary ADC adapted to receive an analog input and to produce a first binary value as a function of said input and a positive analog feedback signal; and
a second binary ADC adapted to receive said analog input and to produce a second binary value as a function of said input and a negative analog feedback signal;
wherein each of said first and second ADCs comprises:
a comparator adapted to provide said respective binary value as a function of said analog signal and said respective feedback signal; and
a feedback network adapted to provide said respective feedback signal as a function of an average of said respective binary values, said feedback network comprising:
an averaging circuit adapted to:
sample said binary value during each of a plurality of sample intervals; and
provide an average value as a function of the average number of non-zero values sampled during an averaging interval comprising a predetermined number of sample intervals;
a low pass filter adapted to receive each of said average values and to provide a smoothed average of said received average values; and
a digital-to-analog converter (DAC) adapted to receive said smoothed average and to convert said smoothed average to said feedback signal.

2. The ADC of claim 1 wherein a sampling frequency of said sample intervals is substantially lower than an operating frequency of said analog input.

3. The ADC of claim 2 further comprising a recoder circuit adapted to provide a digital output in ternary form as a function of said first and second binary values.

4. The ADC of claim 2 wherein said sample interval is substantially smaller than the averaging interval.

5. The ADC of claim 2 wherein said averaging circuit provides said average value once each averaging interval.

6. The ADC of claim 2 wherein said averaging circuit provides said average value once each sampling interval.

7. The ADC of claim 2 wherein said low pass filter is further characterized as an IIR low pass filter.

8. An analog-to-digital converter (ADC) comprising:
a first binary ADC adapted to receive an analog input and to produce a first binary value as a function of said input and a positive analog feedback signal; and
a second binary ADC adapted to receive said analog input and to produce a second binary value as a function of said input and a negative analog feedback signal; and
a recoder circuit adapted to provide a digital output in ternary form as a function of said first and second binary values;
wherein each of said first and second ADCs comprises:
a comparator adapted to provide said respective binary value as a function of said analog signal and said respective feedback signal; and
a feedback network adapted to provide said respective feedback signal as a function of an average of said respective binary values.

9. The ADC of claim 8 wherein said feedback network is further characterized as comprising:
an averaging circuit adapted to:
sample said binary value during each of a plurality of sample intervals; and
provide an average value as a function of the average number of non-zero values sampled during an averaging interval comprising a predetermined number of sample intervals;
a low pass filter adapted to receive each of said average values and to provide a smoothed average of said received average values; and
a digital-to-analog converter (DAC) adapted to receive said smoothed average and to convert said smoothed average to said feedback signal.

10. The ADC of claim 9 wherein a sampling frequency of said sample intervals is substantially lower than an operating frequency of said analog input.

11. The ADC of claim 10 wherein said sample interval is substantially smaller than the averaging interval.

12. The ADC of claim 10 wherein said averaging circuit provides said average value once each averaging interval.

13. The ADC of claim 10 wherein said averaging circuit provides said average value once each sampling interval.

14. The ADC of claim 10 wherein said low pass filter is further characterized as an IIR low pass filter.

* * * * *